(12) United States Patent
Yamazawa et al.

(10) Patent No.: US 10,196,513 B2
(45) Date of Patent: *Feb. 5, 2019

(54) EPOXY RESIN COMPOSITION, SEMICONDUCTOR SEALING AGENT, AND SEMICONDUCTOR DEVICE

(71) Applicant: NAMICS CORPORATION, Niigata (JP)

(72) Inventors: Tomoya Yamazawa, Niigata (JP); Kazuyuki Kohara, Niigata (JP); Kodai Okoshi, Niigata (JP); Nobuyuki Abe, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/039,231

(22) PCT Filed: Nov. 28, 2014

(86) PCT No.: PCT/JP2014/005967
§ 371 (c)(1),
(2) Date: May 25, 2016

(87) PCT Pub. No.: WO2015/079708
PCT Pub. Date: Jun. 4, 2015

(65) Prior Publication Data
US 2017/0022356 A1    Jan. 26, 2017

(30) Foreign Application Priority Data
Nov. 29, 2013   (JP) ................................. 2013-247567

(51) Int. Cl.
*C08L 63/00* (2006.01)
*C08G 59/40* (2006.01)
(Continued)

(52) U.S. Cl.
CPC .............. *C08L 63/00* (2013.01); *C08G 59/24* (2013.01); *C08G 59/245* (2013.01); *C08G 59/40* (2013.01);
(Continued)

(58) Field of Classification Search
CPC ... C08L 63/00; C08L 2203/206; C08G 59/40; C08G 59/245; C08G 59/42; C08G 59/50;
(Continued)

(56) References Cited

U.S. PATENT DOCUMENTS

| 6,288,169 B1 * | 9/2001 | Usui ....................... C08L 63/04 525/109 |
| 8,586,467 B2 | 11/2013 | Yoshii |
| 2011/0316149 A1 | 12/2011 | Yoshii |
| 2012/0184646 A1 | 7/2012 | Yajima |

FOREIGN PATENT DOCUMENTS

| JP | 2004256644 A * | 9/2004 | .............. C08L 63/00 |
| JP | 2011006618 A2 | 1/2011 | |

(Continued)

OTHER PUBLICATIONS

Ichikawa, JP 2004-256644 A machine translation in English, Sep. 16, 2004 (Year: 2004).*

(Continued)

*Primary Examiner* — David T Karst
(74) *Attorney, Agent, or Firm* — Rankin, Hill & Clark LLP

(57) ABSTRACT

An epoxy resin composition includes: (A) epoxy resin; (B) a curing agent; (C) 0.1 to 10 mass % of silica filler with an average particle size of 10 nm or more and 100 nm or less; (D) 47 to 75 mass % of silica filler with an average particle size of 0.3 μm or more and 2 μm or less; and (E) 0.1 to 8 mass % of elastomer, wherein the component (C) and the component (D) are contained by 50.1 to 77 mass % in total.

15 Claims, 1 Drawing Sheet

(51) Int. Cl.
- *H01L 23/29* (2006.01)
- *H01L 23/00* (2006.01)
- *C08G 59/24* (2006.01)
- *C08G 59/42* (2006.01)
- *C08G 59/50* (2006.01)
- *C08G 59/62* (2006.01)
- *H01L 23/31* (2006.01)
- *H01L 21/56* (2006.01)

(52) U.S. Cl.
CPC ............. *C08G 59/42* (2013.01); *C08G 59/50* (2013.01); *C08G 59/5033* (2013.01); *C08G 59/621* (2013.01); *H01L 23/29* (2013.01); *H01L 23/293* (2013.01); *H01L 23/295* (2013.01); *H01L 23/3142* (2013.01); *H01L 24/29* (2013.01); *H01L 24/83* (2013.01); *C08L 2203/206* (2013.01); *H01L 21/563* (2013.01); *H01L 24/13* (2013.01); *H01L 24/16* (2013.01); *H01L 24/32* (2013.01); *H01L 2224/131* (2013.01); *H01L 2224/1312* (2013.01); *H01L 2224/13101* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/16227* (2013.01); *H01L 2224/2929* (2013.01); *H01L 2224/29291* (2013.01); *H01L 2224/29387* (2013.01); *H01L 2224/32225* (2013.01); *H01L 2224/73204* (2013.01); *H01L 2224/81193* (2013.01); *H01L 2224/8385* (2013.01); *H01L 2224/83102* (2013.01); *H01L 2224/83862* (2013.01); *H01L 2924/0002* (2013.01)

(58) Field of Classification Search
CPC . C08G 59/5033; C08G 59/621; H01L 23/295; H01L 24/29; H01L 24/83; H01L 23/29; H01L 23/3142; H01L 23/293; H01L 2924/0002; H01L 24/13; H01L 24/16; H01L 24/32; H01L 2224/131; H01L 2224/13101; H01L 2224/13109; H01L 2224/13111; H01L 2224/13113; H01L 2224/13116; H01L 2224/13118; H01L 2224/1312; H01L 2224/13139; H01L 2224/13144; H01L 2224/13147; H01L 2224/13155; H01L 2224/13157; H01L 2224/13164; H01L 2224/16227; H01L 2224/2929; H01L 2224/29291; H01L 2224/29387; H01L 2224/32225; H01L 2224/73204; H01L 2224/81193; H01L 2224/83102; H01L 2224/8385; H01L 2224/83862; H01L 21/563
USPC .................................. 523/435, 443; 525/523
See application file for complete search history.

(56) References Cited

FOREIGN PATENT DOCUMENTS

| | | |
|---|---|---|
| JP | 2012149111 A2 | 8/2012 |
| JP | 2012211269 A2 | 11/2012 |
| JP | 2015-054951 | 3/2015 |
| WO | 2010103934 A1 | 9/2010 |

OTHER PUBLICATIONS

International Search Report dated Jan. 13, 2015 filed in PCT/JP2014/005967.

Japanese Office Action dated Oct. 2, 2018 issued for the corresponding Japanese patent application No. 2015-550571 and its English translation.

* cited by examiner

EPOXY RESIN COMPOSITION, SEMICONDUCTOR SEALING AGENT, AND SEMICONDUCTOR DEVICE

CROSS REFERENCE TO RELATED APPLICATION

This application claims priority from Japanese Patent Application No. 2013-247567 filed with the Japan Patent Office on Nov. 29, 2013, the entire content of which is hereby incorporated by reference.

TECHNICAL FIELD

The present invention relates to an epoxy resin composition, a semiconductor sealing agent, and a semiconductor device.

BACKGROUND ART

One way to mount a semiconductor chip (semiconductor element) on a wiring substrate is flip-chip mounting. Flip-chip mounting is one mounting method where a projecting electrode (bump) is provided for a surface of a semiconductor chip and this surface is directly connected to a wiring substrate. For protecting the connected semiconductor chip and wiring substrate and the bumps, the space between the semiconductor chip and the wiring substrate is filled with the sealing resin called an under-filling agent.

For the under-filling agent, epoxy resin is mainly used. The epoxy resin, the semiconductor chip, and the wiring substrate have different linear expansion coefficients. The connected portion with the different linear expansion coefficient may fail to absorb the stress, and if the stress is not absorbed, a crack is possibly formed in that connection portion. In order to suppress the crack, filler with a relatively small linear expansion coefficient, such as silicon dioxide, is dispersed in the under-filling agent.

Incidentally, in recent years, metal pillar bumps have been used in the flip-chip mounting. For example, a copper pillar bump has the following advantages over the conventional solder bump: the pitch of the bump can be reduced by the use of the copper pillar, the influence on the environment is suppressed because solder is used less; the copper pillar bump has such high thermal conductivity that the heat dissipation is excellent; and the electrical conductivity is so high that the parasitic resistance can be reduced. However, using the metal pillar bump may cause the filler in the under-filling agent to separate. It is considered that the separation of the filler occurs because the potential difference between the metal used in the pillar and the metal used in the solder causes electrophoresis of the filler in the under-filling agent.

In view of this, examinations have been conducted on the technique to suppress the separation of the filler from the under-filling agent (promote the dispersion of filler). Patent Literature 1 has disclosed the method of mounting the electronic component, in which covering the surface of the metal pillar with solder promotes the dispersion of filler in the under-filling and improves the connection reliability of the flip-chip mounting.

CITATION LIST

Patent Literature

PATENT LITERATURE 1: WO2010/103934

SUMMARY

Problems to be Solved

The present invention is to provide a resin composition that promotes the dispersion of filler without a special step of, for example, covering the surface of the metal pillar with solder.

Solution to the Problems

An epoxy resin composition according to the present invention includes: (A) epoxy resin; (B) a curing agent; (C) 0.1 to 10 mass % of silica filler with an average particle size of 10 nm or more and 100 nm or less; (D) 47 to 75 mass % of silica filler with an average particle size of 0.3 μm or more and 2 μm or less; and (E) 0.1 to 8 mass % of elastomer. The component (C) and the component (D) are contained by 50.1 to 77 mass % in total.

At least one of the component (C) and the component (D) may be subjected to surface processing with a silane coupling agent.

The component (D) may be subjected to surface processing with amino silane with a structure represented by Formula (1):

[Chemical Formula 1]

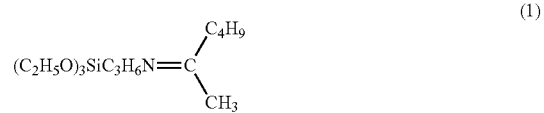

The component (B) may be included by 0.5 equivalents or more and 1.8 equivalents or less relative to 1 equivalent of epoxy group of the component (A).

The component (B) may be an acid anhydride curing agent, a phenolic resin curing agent, or an amine curing agent.

The component (A) may include at least one of bisphenol F epoxy resin, bisphenol A epoxy resin, naphthalene epoxy resin, and aminophenol epoxy resin.

Moreover, in the above aspect, the component (E) may include at least one of butadiene elastomer, silicone elastomer, acrylic copolymer, styrene butadiene elastomer, butadiene acrylonitrile 2,3-epoxypropyl methacrylate divinylbenzene copolymer, butadiene acrylonitrile methacrylic acid divinylbenzene copolymer, amino-terminated butadiene acrylonitrile copolymer, and carboxyl-terminated butadiene acrylonitrile copolymer.

This epoxy resin composition may be manufactured in a manner that a master batch is formed by mixing the component (C) in at least a part of the component (A) and another component is mixed in the master batch.

The present invention also provides a semiconductor sealing agent including the epoxy resin composition.

The semiconductor sealing agent may seal the conductor part being formed of two or more kinds of metals or alloys.

The two or more kinds of metals or alloys are two or more kinds of metals or alloys based on the metals, and the metals may be selected from the group consisting of Au, Ag, Cu, Sn, Pb, Ni, Pd, Co, Cd, Bi, In, Sb, and Zn.

The conductor part of the semiconductor device to be sealed may include two kinds of metals or alloys; and a cross section of the epoxy resin composition sealing the conductor part is divided into two regions along a border between the two kinds of metals or alloys, and a filler dispersion index calculated by a formula below using an occupation ratio of the components (C) and (D) in each region may be 50 or more and 150 or less.

Filler dispersion index=100×(occupation ratio of region $Ra$)/(occupation ratio of region $Rb$)

Moreover, the present invention provides a semiconductor device including the semiconductor sealing agent.

Effects of the Invention

According to the present invention, the dispersion of filler can be promoted.

DESCRIPTION OF EMBODIMENTS

Figure 1:
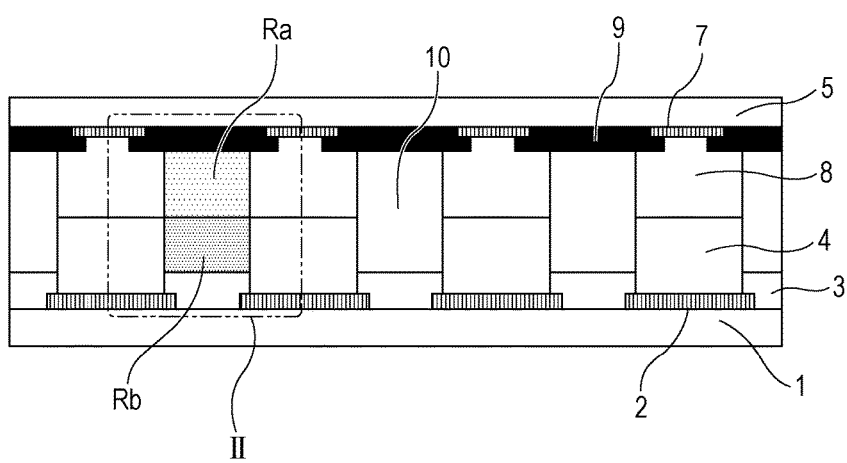
FIG. 1 is a diagram for describing the evaluation of the dispersion index of the filler.

An epoxy resin composition according to the present invention includes (A) epoxy resin, (B) a curing agent, (C) small-diameter silica filler, (D) large-diameter silica filler, and (E) elastomer.

Examples of the component (A) include bisphenol F epoxy resin, bisphenol A epoxy resin, naphthalene epoxy resin, aminophenol epoxy resin, phenol novolac epoxy resin, alicyclic epoxy resin, siloxane epoxy resin, biphenyl epoxy resin, glycidyl ester epoxy resin, glycidyl amine epoxy resin, hydantoin epoxy resin, and epoxy resin containing a naphthalene ring. Any of the compounds given above may be used alone or two or more thereof may be mixed to be used in the epoxy resin composition.

Examples of the component (B) include an acid anhydride curing agent, a phenolic resin curing agent, and an amine curing agent. The component (B) is preferably contained by 0.5 equivalents or more and 1.8 equivalents or less relative to 1 equivalent of epoxy group of the component (A).

Examples of the component (C) and the component (D) include amorphous silica, crystalline silica, fused silica, pulverized silica, and nanosilica. The shape of the component (C) and the component (D) is not particularly limited and may be, for example, a particle, powder, or scaly. The average particle size of the silica filler in the present invention refers to the D50 (median size) based on volume, which is measured by the laser diffraction method or with the field emission scanning electron microscope (FE-SEM).

The average particle size of the component (C) is preferably 10 nm or more and 100 nm or less. The average particle size of the component (D) is preferably 0.3 μm or more and 2 μm or less. The epoxy resin composition according to the present invention preferably contains the component (C) by 0.1 mass % or more and 10 mass % or less and the component (D) by 47 mass % or more and 75 mass % or less. The epoxy resin composition according to the present invention preferably contains the component (C) and the component (D) by 50.1 mass % or more and 77 mass % or less in total and more preferably by 52 mass % or more and 77 mass % or less in total.

At least one of the component (C) and the component (D) may be subjected to surface processing with a silane coupling agent. Examples of the silane coupling agent used in the surface processing include various silane coupling agents such as epoxy, methacrylic, amino, vinyl, glycidoxy, and mercapto silane coupling agents. In the surface processing for the component (D), amino silane with a structure represented by Formula (1) is preferably used.

[Chemical Formula 2]

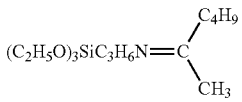

(1)

Examples of the component (E) include butadiene elastomer, silicone elastomer, acrylic copolymer, styrene butadiene elastomer, butadiene acrylonitrile 2,3-epoxypropyl methacrylate divinylbenzene copolymer, butadiene acrylonitrile methacrylic acid divinylbenzene copolymer, amino-terminated butadiene acrylonitrile copolymer, and carboxyl-terminated butadiene acrylonitrile copolymer. The component (E) may be any of the above compounds or a mixture of two or more compounds described above. That is to say, the component (E) may be an elastomer containing at least one of the above compounds. The component (E) is preferably contained by 0.1 mass % or more and 8 mass % or less.

The epoxy resin composition may include, in addition to the components (A), (B), (C), (D), and (E), an additive such as an ion trapping agent, a pigment, a dye, a defoaming agent, a stress relieving agent, a pH adjuster, a promoter, a surfactant, or a coupling agent.

The epoxy resin composition is used as the semiconductor sealing agent (under-filling agent) when the electronic device such as a semiconductor element is mounted by the flip-chip mounting or BGA (Ball Grid Array)/CSP (Chip Size Package) mounting. The epoxy resin composition may be used as an additive when the electronic device is attached to the substrate or the package.

In the flip-chip mounting or the BGA/CSP mounting, first, the semiconductor element and the substrate (or the package) are bonded. Next, the semiconductor sealing agent is injected into the space between the semiconductor element and the substrate. Specifically, the semiconductor sealing agent is applied along the outer periphery of the semiconductor element. The semiconductor sealing agent spreads into the space through the capillary phenomenon. Therefore, the semiconductor sealing agent is preferably liquid at the temperature of this process. The injected semiconductor sealing agent is thermally cured by the heat application (for example, at 80 to 165° C.).

FIG. 1 illustrates an example of a semiconductor device sealed with the semiconductor sealing agent according to the present invention. FIG. 1 illustrates an example of flip-chip mounting with the use of metal pillars. FIG. 1 illustrates a cross section of the semiconductor device.

Electrodes 2 are formed on a substrate 1. An insulating film 3 is formed in an area except the electrodes 2. On each electrode 2, a solder bump 4 is disposed. Electrodes 7 are formed on a semiconductor chip 5 (below the semiconductor chip 5 in the drawing). The entire semiconductor chip 5 is covered with a passivation 9. Holes are opened in parts of the passivation 9 corresponding to the electrodes 7. On the electrode 7, a copper pillar 8 as one kind of the metal pillar is formed.

The copper pillar 8 is formed of copper (Cu) or alloy mainly containing copper. The solder bump 4 is formed of alloy mainly containing tin (Sn). The materials of the solder bump and the metal pillar are not limited to the materials described here. The solder bump and the metal pillar are formed of, for example, two or more kinds of metals or alloys based on metals and the metals are selected from Au, Ag, Cu, Sn, Pb, Ni, Pd, Co, Cd, Bi, In, Sb, and Zn. The semiconductor sealing agent according to this embodiment is used to seal a conductor part of the semiconductor device, the conductor part being formed of two or more kinds of metals or alloys based on the metals.

The epoxy resin composition is manufactured by stirring, melting, mixing, or dispersing the components (A) to (E) and other additives at the same time or separately, while heat is applied if necessary. The method of mixing, stirring, and dispersing is not limited in particular. A raikai mixer including a stirrer and a heater, a triple roll mill, a ball mill, a planetary mixer, a bead mill, or the like can be used. These devices may be used in combination. Here, the epoxy resin composition can be manufactured in a manner that a master batch is formed by mixing the component (A) and the component (C) and another component is mixed in the master batch.

EXAMPLES (1) Preparation of Epoxy Resin Composition

Tables 1 to 10 show the compositions of the epoxy resin compositions used as the sealing agent in Examples 1 to 37 and Comparative Examples 1 to 9. These tables also show the evaluation results on the epoxy resin compositions used as the sealing agent to be described below. In Tables 1 to 10, the compositions of the epoxy resin compositions are expressed in part by mass (corresponding to mass % because the total part by mass is 100) except the equivalent ratio.

As the component (A) in the tables, at least one of epoxy resins a1 to a5 was used. As the epoxy resin a1, YDF8170 manufactured by NIPPON STEEL & SUMIKIN CHEMICAL CO., LTD., one kind of bisphenol F epoxy resin, was used. As the epoxy resin a2, 850CRP manufactured by DIC Corporation, one kind of bisphenol A epoxy resin, was used. As the epoxy resin a3. HP-4032D manufactured by DIC Corporation, one kind of naphthalene epoxy resin, was used. As the epoxy resin a4, jer630 manufactured by Mitsubishi Chemical Corporation, one kind of aminophenol epoxy resin, was used. As the epoxy resin a5, ZXI 658GS manufactured by NIPPON STEEL & SUMIKIN CHEMICAL CO., LTD., one kind of cycloaliphatic epoxy resin, was used.

As the component (B) in the tables, at least one of curing agents b1 to b5 was used. As the curing agent b1, an amine curing agent of Kayahard AA manufactured by Nippon Kayaku Co., Ltd was used. As the curing agent b2, an amine curing agent of EHIO5L manufactured by ADEKA CORPORATION was used. As the curing agent b3, an amine curing agent of ETHACURE100 manufactured by Albermarle was used. As the curing agent b4, an acid anhydride curing agent of YH307 manufactured by Mitsubishi Chemical Corporation was used. As the curing agent b5, a phenolic resin curing agent of MEH-8005 manufactured by MEIWA PLASTIC INDUSTRIES, LTD. was used.

As the component (C) in the tables, any of YA010C (average particle size: 10 nm), YA050C (average particle size: 50 nm), and YC100C (average particle size: 100 nm) manufactured by Admatechs Company Limited was used. The average particle size is the median size (D50). The average particle size is measured with the field emission scanning electron microscope (FE-SEM).

As the component (D) in the tables, any of Hyprecica 0.2 μm (average particle size: 0.2 μm) manufactured by UBE EXSYMO CO., LTD, SE-1050 (average particle size: 0.3 μm), SE-2300 (average particle size: 0.6 μm), SE-4050 (average particle size: 1 μm), and SE-6050 (average particle size: 2 μm) manufactured by Admatechs Company Limited was used. The average particle size is the median size (D50). The average particle size is measured with the laser diffraction scattering type particle size distribution meter.

As the surface processing agent for the component (D), any of surface processing agents f1 to f3 was used. As the surface processing agent f1, KBM403 (3-glycidoxypropyl trimethoxysilane) manufactured by Shin-Etsu Chemical Co., Ltd. was used. As the surface processing agent f2, KBM503 (3-methacryloxypropyl trimethoxysilane) manufactured by Shin-Etsu Chemical Co., Ltd. was used. As the surface processing agent f3, KBE9103 (3-triethoxysilyl-N-(1,3-dimethyl-butylidene)propylamine, compound represented by Formula (1)) manufactured by Shin-Etsu Chemical Co., Ltd. was used.

As the component (E) in the tables, at least one of elastomers e1 to e9 was used. As the elastomer e1, MX137 manufactured by KANEKA CORPORATION, one kind of butadiene elastomer, was used. As the elastomer e2, MX965 manufactured by KANEKA CORPOTAION, one kind of silicone elastomer, was used. As the elastomer e3, MX135 manufactured by KANEKA CORPORATION, one kind of styrene butadiene elastomer, was used. As the elastomer e4, M52N manufactured by ARKEMA K.K., one kind of acrylic copolymer, was used. As the elastomer e5. XER-81 manufactured by JSR Corporation, one kind of butadiene acrylonitrile 2,3-epoxypropyl methacrylate divinylbenzene copolymer, was used. As the elastomer e6, XER-91 manufactured by JSR Corporation, one kind of butadiene acrylonitrile methacrylic acid divinylbenzene copolymer, was used. As the elastomer e7, ATBN manufactured by UBE INDUSTRIES, LTD, one kind of amino-terminated butadiene acrylonitrile copolymer, was used. As the elastomer e8, CTBN manufactured by UBE INDUSTRIES, LTD, one kind of carboxyl-terminated butadiene acrylonitrile copolymer, was used. As the elastomer e9, KMP-605 manufactured by Shin-Etsu Chemical Co., Ltd., one kind of silicone elastomer, was used.

In addition to the components (A) to (E), 2P4MZ manufactured by SHIKOKU CHEMICALS CORPORATION was used as the curing promoter.

(2) Evaluations

Evaluations were carried out as below with the epoxy resin compositions in Examples 1 to 37 and Comparative Examples 1 to 9 used as samples.

(2-1) Evaluations on Dispersion Index

Figure 2:
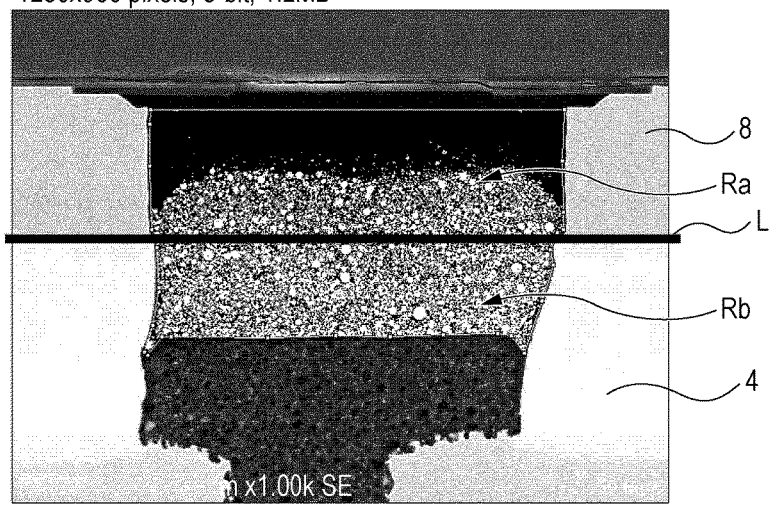
FIG. 2 is a magnified view of a region II illustrated in FIG. 1.

FIG. 2 is a sectional photograph of a semiconductor device. This diagram is a sectional photograph of a region (region II) shown by "II" in FIG. 1. The region II in FIG. 1 includes a cross section of an under-filling agent 10 cured after being fed into a space closed by the wiring substrate 1, the chip board 5, the copper pillars 8, and the solders 4. This region II was photographed using, for example, a scanning electron microscope (SEM). This photographed image is analyzed by a computer with image processing software as below. First, in this photographed image, a user specifies a region of the under-filling agent 10. Based on the central value of the luminance distribution in the specified region, the binarizing process is performed. In the binarized image, the white part corresponds to the filler and the black part corresponds to the resin components other than the filler. Next, the specified region is divided into two sections along an extension line of a border L between the copper pillar 8 and the solder 4: a region Ra on the copper pillar 8 side, and a region Rb on the solder 4 side. Based on the images in the region Ra on the copper pillar 8 side and the region Rb on the solder 4 side, the occupation ratio of the silica filler in each of the regions is calculated. The dispersion index is calculated by the formula:

Dispersion index=100×(occupation ratio of region Ra)/(occupation ratio of region Rb)

A dispersion index of 100 means that the filler is uniformly distributed in each region. A dispersion index of less than 100 indicates that the filler is distributed densely in the region Rb. When the dispersion index is smaller, the filler is distributed more densely in the region Rb. When the dispersion index is increased toward 100, the filler is distributed more uniformly. Here, when the dispersion index is 50 or less, the uniformity of the filler distribution is determined low. Note that the image processing employs the ImageJ of National Institutes of Health (NIH).

(2-2) Evaluation on Viscosity

With the Brookfield rotatable viscometer, the viscosity of the epoxy resin compositions at 25° C. was measured at 50 rpm.

(2-3) TI (Thixotropic Index) Value

The viscosity of the epoxy resin composition was measured at 5 rpm and 50 rpm. The value obtained by dividing the value of the viscosity at 5 rpm by the value of the viscosity at 50 rpm was used as the TI value.

(2-4) Evaluations on Injection Property

The evaluation sample was injected into the gap (space) of 20 μm at 110° C. The time required for the injected evaluation sample to reach the position 20 mm from the entrance was measured. As it takes shorter time to reach, the injection property is better. The "-" mark in the column of the injection property indicates that the evaluation sample failed to reach the position 20 mm (i.e., defective).

(2-5) Evaluations on Adhesion Strength

The evaluation sample was potted by approximately 0.5 mg on FR-4. A silicon chip with a length of 2 mm on each side was placed thereon and the silicon chip was left for five minutes under room temperature. After that, the evaluation sample was cured using a fan dryer at 150° C. for 120 minutes. The adhesion strength of the thusly obtained test piece was measured using a tabletop strength testing machine (1605HTP, manufactured by AIKOH ENGINEERING CO., LTD.). The average value from the ten measurement values was used as the test value.

(3) Evaluation Results (3-1) Amount of Elastomer

Table 1 shows the compositions of the epoxy resin compositions and results of evaluations in Examples 1 to 5 and Comparative Examples 1 and 2. In the table, the component of the epoxy resin composition is represented by part by mass (mass %). In Table 1, the content amount of the component (E) varies. In Comparative Example 1 where neither the component (C) nor the component (E) was contained, the dispersion index was 38. On the other hand, in Examples 1 to 5 where the component (C) and the component (E) were contained, the dispersion index was 50 or more. Containing the component (E) more made the dispersion index closer to 100. That is to say, as the component (E) was contained more, the uniformity of the filler distribution was improved. However, when the component (E) was contained by 8.3 mass % (Comparative Example 2), the defect occurred in the injection property test.

TABLE 1

|  |  |  | Comparative Example 1 | Example 1 | Example 2 | Example 3 | Example 4 | Example 5 | Comparative Example 2 |
|---|---|---|---|---|---|---|---|---|---|
| Composition | Component (A) | a1 | 30.7 | 30.5 | 30.4 | 29.7 | 27.9 | 25.1 | 24.8 |
|  |  | a2 |  |  |  |  |  |  |  |
|  |  | a3 |  |  |  |  |  |  |  |
|  |  | a4 |  |  |  |  |  |  |  |
|  |  | a5 |  |  |  |  |  |  |  |
|  | Component (B) | b1 | 12.3 | 12.3 | 12.2 | 12.0 | 11.2 | 10.1 | 9.9 |
|  |  | b2 |  |  |  |  |  |  |  |
|  |  | b3 |  |  |  |  |  |  |  |
|  |  | b4 |  |  |  |  |  |  |  |
|  |  | b5 |  |  |  |  |  |  |  |
|  | Component (C) | 10 nm | 0.0 | 2.0 | 2.0 | 2.0 | 2.0 | 2.0 | 2.0 |
|  |  | 50 nm |  |  |  |  |  |  |  |
|  |  | 100 nm |  |  |  |  |  |  |  |
|  |  | 0.2 μm |  |  |  |  |  |  |  |
|  | Component (D) | 0.3 μm |  |  |  |  |  |  |  |
|  |  | 0.6 μm | 57.0 | 55.0 | 55.0 | 55.0 | 55.0 | 55.0 | 55.0 |
|  |  | 1 μm |  |  |  |  |  |  |  |
|  |  | 2 μm |  |  |  |  |  |  |  |
|  | Surface processing agent for Component (D) |  | f1 | f1 | f1 | f1 | f1 | f1 | f1 |
|  | Equivalent ratio | eq | 1.0 | 1.0 | 1.0 | 1.0 | 1.0 | 1.0 | 1.0 |
|  | Component (E) | e1 | 0.0 | 0.2 | 0.4 | 1.3 | 3.9 | 7.8 | 8.3 |
|  |  | e2 |  |  |  |  |  |  |  |
|  |  | e3 |  |  |  |  |  |  |  |
|  |  | e4 |  |  |  |  |  |  |  |
|  |  | e5 |  |  |  |  |  |  |  |
|  |  | e6 |  |  |  |  |  |  |  |
|  |  | e7 |  |  |  |  |  |  |  |
|  |  | e8 |  |  |  |  |  |  |  |
|  |  | e9 |  |  |  |  |  |  |  |
|  | Promoter |  |  |  |  |  |  |  |  |
|  | Total |  | 100.0 | 100.0 | 100.0 | 100.0 | 100.0 | 100.0 | 100.0 |
| Evaluation | Dispersion index |  | 38 | 60 | 71 | 73 | 92 | 100 | 102 |
|  | Viscosity | Pa·s | 12 | 18 | 19 | 22 | 27 | 76 | 96 |
|  | TI |  | 0.7 | 0.8 | 0.8 | 0.8 | 0.9 | 0.9 | 0.9 |

TABLE 1-continued

|  |  | Comparative Example 1 | Example 1 | Example 2 | Example 3 | Example 4 | Example 5 | Comparative Example 2 |
|---|---|---|---|---|---|---|---|---|
| Injection property | sec | 91 | 111 | 113 | 134 | 188 | 980 | — |
| Adhesion strength | N | 353 | 353 | 353 | 363 | 343 | 323 | 304 |

(3-2) Kind of Elastomer

Table 2 shows the compositions of the epoxy resin compositions and results of evaluations in Examples 3 and 6 to 13. In Table 2, the kind of the component (E) varies. Using any of the elastomers e1 to e9 as the component (E) can improve the uniformity of the filler distribution.

component (C) was contained by 0.05 mass % (Comparative Example 3), the dispersion index was 44 and the filler distribution was inhomogeneous. As the component (C) was contained more, the dispersion index was closer to 100, thereby improving the uniformity of the filler distribution. Accordingly, the component (C) is preferably contained by

TABLE 2

|  |  |  | Example 3 | Example 6 | Example 7 | Example 8 | Example 9 | Example 10 | Example 11 | Example 12 | Example 13 |
|---|---|---|---|---|---|---|---|---|---|---|---|
| Composition | Component (A) | a1 | 29.7 | 29.7 | 29.7 | 29.7 | 29.7 | 29.7 | 29.7 | 29.7 | 29.7 |
|  |  | a2 |  |  |  |  |  |  |  |  |  |
|  |  | a3 |  |  |  |  |  |  |  |  |  |
|  |  | a4 |  |  |  |  |  |  |  |  |  |
|  |  | a5 |  |  |  |  |  |  |  |  |  |
|  | Component (B) | b1 | 12.0 | 12.0 | 12.0 | 12.0 | 12.0 | 12.0 | 12.0 | 12.0 | 12.0 |
|  |  | b2 |  |  |  |  |  |  |  |  |  |
|  |  | b3 |  |  |  |  |  |  |  |  |  |
|  |  | b4 |  |  |  |  |  |  |  |  |  |
|  |  | b5 |  |  |  |  |  |  |  |  |  |
|  | Component (C) | 10 nm | 2.0 | 2.0 | 2.0 | 2.0 | 2.0 | 2.0 | 2.0 | 2.0 | 2.0 |
|  |  | 50 nm |  |  |  |  |  |  |  |  |  |
|  |  | 100 nm |  |  |  |  |  |  |  |  |  |
|  | Component (D) | 0.2 μm |  |  |  |  |  |  |  |  |  |
|  |  | 0.3 μm |  |  |  |  |  |  |  |  |  |
|  |  | 0.6 μm | 55.0 | 55.0 | 55.0 | 55.0 | 55.0 | 55.0 | 55.0 | 55.0 | 55.0 |
|  |  | 1 μm |  |  |  |  |  |  |  |  |  |
|  |  | 2 μm |  |  |  |  |  |  |  |  |  |
|  | Surface processing agent for Component (D) |  | f1 | f1 | f1 | f1 | f1 | f1 | f1 | f1 | f1 |
|  | Equivalent ratio | eq | 1.0 | 1.0 | 1.0 | 1.0 | 1.0 | 1.0 | 1.0 | 1.0 | 1.0 |
|  | Component (E) | e1 | 1.3 |  |  |  |  |  |  |  |  |
|  |  | e2 |  | 1.3 |  |  |  |  |  |  |  |
|  |  | e3 |  |  | 1.3 |  |  |  |  |  |  |
|  |  | e4 |  |  |  | 1.3 |  |  |  |  |  |
|  |  | e5 |  |  |  |  | 1.3 |  |  |  |  |
|  |  | e6 |  |  |  |  |  | 1.3 |  |  |  |
|  |  | e7 |  |  |  |  |  |  | 1.3 |  |  |
|  |  | e8 |  |  |  |  |  |  |  | 1.3 |  |
|  |  | e9 |  |  |  |  |  |  |  |  | 1.3 |
|  | Promoter |  |  |  |  |  |  |  |  |  |  |
|  | Total |  | 100.0 | 100.0 | 100.0 | 100.0 | 100.0 | 100.0 | 100.0 | 100.0 | 100.0 |
| Evaluation | Dispersion index |  | 73 | 73 | 68 | 70 | 72 | 72 | 97 | 65 | 67 |
|  | Viscosity | Pa·s | 22 | 27 | 15 | 29 | 36 | 35 | 45 | 21 | 17.6 |
|  | TI |  | 0.8 | 0.8 | 0.8 | 0.9 | 0.9 | 0.9 | 1.1 | 0.9 | 0.7 |
|  | Injection property | sec | 134 | 180 | 135 | 152 | 149 | 143 | 323 | 269 | 142 |
|  | Adhesion strength | N | 363 | 363 | 363 | 363 | 363 | 363 | 255 | 265 | 333 |

(3-3) Amount of Small-Diameter Silica Filler

Table 3 shows the compositions of the epoxy resin compositions and results of evaluations in Examples 3 and 14 to 16, and Comparative Examples 3 and 4. In Table 3, the content amount of the component (C) varies. When the 0.1 mass % or more. When the component (C) was contained by 11 mass %, however, the viscosity was 132 Pa·s. From the viewpoint of the viscosity appropriate as the sealing agent, the component (C) is preferably contained by 10 mass % or less.

TABLE 3

| | | | Comparative Example 3 | Example 14 | Example 3 | Example 15 | Example 16 | Comparative Example 4 |
|---|---|---|---|---|---|---|---|---|
| Composition | Component (A) | a1 | 29.65 | 29.7 | 29.7 | 29.7 | 29.7 | 29.7 |
| | | a2 | | | | | | |
| | | a3 | | | | | | |
| | | a4 | | | | | | |
| | | a5 | | | | | | |
| | Component (B) | b1 | 12.0 | 12.0 | 12.0 | 12.0 | 12.0 | 12.0 |
| | | b2 | | | | | | |
| | | b3 | | | | | | |
| | | b4 | | | | | | |
| | | b5 | | | | | | |
| | Component (C) | 10 nm | 0.05 | 0.10 | 2.00 | 5.00 | 10.00 | 11.00 |
| | | 50 nm | | | | | | |
| | | 100 nm | | | | | | |
| | Component (D) | 0.2 μm | | | | | | |
| | | 0.3 μm | | | | | | |
| | | 0.6 μm | 57.0 | 56.9 | 55.0 | 52.0 | 47.0 | 46.0 |
| | | 1 μm | | | | | | |
| | | 2 μm | | | | | | |
| | Surface processing agent for Component (D) | | f1 | f1 | f1 | f1 | f1 | f1 |
| | Equivalent ratio | eq | 1.0 | 1.0 | 1.0 | 1.0 | 1.0 | 1.0 |
| | Component (E) | e1 | 1.3 | 1.3 | 1.3 | 1.3 | 1.3 | 1.3 |
| | | e2 | | | | | | |
| | | e3 | | | | | | |
| | | e4 | | | | | | |
| | | e5 | | | | | | |
| | | e6 | | | | | | |
| | | e7 | | | | | | |
| | | e8 | | | | | | |
| | | e9 | | | | | | |
| | Promoter | | | | | | | |
| | Total | | 100.0 | 100.0 | 100.0 | 100.0 | 100.0 | 100.0 |
| Evaluation | Dispersion index | | 44 | 57 | 73 | 90 | 105 | 104 |
| | Viscosity | Pa·s | 12 | 13 | 22 | 33.2 | 89 | 132 |
| | TI | | 0.7 | 0.7 | 0.8 | 1 | 1.3 | 1.3 |
| | Injection property | sec | 121 | 122 | 134 | 173 | 259 | 314 |
| | Adhesion strength | N | 353 | 353 | 363 | 363 | 372 | 372 |

(3-4) Average Particle Size of Small-Diameter Silica Filler

Table 4 shows the compositions of the epoxy resin compositions and evaluation results in Examples 3, 17 and 18 and Comparative Example 5. In Table 4, the average particle size of the component (C) varies. In Comparative Example 5, the component (D) with an average particle size of 0.2 μm (i.e., 200 nm) is used instead of the component (C). Without the component (C) (Comparative Example 5), the dispersion index is unsatisfying. With the component (C), the dispersion index is improved. As the average particle size of the component (C) is smaller, the dispersion index is improved more. That is to say, the dispersion index is improved when the average particle size of the component (C) is in the range of 10 to 100 nm.

TABLE 4

| | | | Example 3 | Example 17 | Example 18 | Comparative Example 5 |
|---|---|---|---|---|---|---|
| Composition | Component (A) | a1 | 29.7 | 29.7 | 29.7 | 29.7 |
| | | a2 | | | | |
| | | a3 | | | | |
| | | a4 | | | | |
| | | a5 | | | | |
| | Component (B) | b1 | 12.0 | 12.0 | 12.0 | 12.0 |
| | | b2 | | | | |
| | | b3 | | | | |
| | | b4 | | | | |
| | | b5 | | | | |
| | Component (C) | 10 nm | 2.0 | | | |
| | | 50 nm | | 2.0 | | |
| | | 100 nm | | | 2.0 | |

TABLE 4-continued

|  |  | Example 3 | Example 17 | Example 18 | Comparative Example 5 |
|---|---|---|---|---|---|
| Component (D) | 0.2 μm |  |  |  | 2.0 |
|  | 0.3 μm |  |  |  |  |
|  | 0.6 μm | 55.0 | 55.0 | 55.0 | 55.0 |
|  | 1 μm |  |  |  |  |
|  | 2 μm |  |  |  |  |
| Surface processing agent for Component (D) |  | f1 | f1 | f1 | f1 |
| Equivalent ratio | eq | 1.0 | 1.0 | 1.0 | 1.0 |
| Component (E) | e1 | 1.3 | 1.3 | 1.3 | 1.3 |
|  | e2 |  |  |  |  |
|  | e3 |  |  |  |  |
|  | e4 |  |  |  |  |
|  | e5 |  |  |  |  |
|  | e6 |  |  |  |  |
|  | e7 |  |  |  |  |
|  | e8 |  |  |  |  |
|  | e9 |  |  |  |  |
| Promoter |  |  |  |  |  |
| Total |  | 100.0 | 100.0 | 100.0 | 100.0 |
| Evaluation Dispersion index |  | 73 | 62 | 55 | 45 |
| Viscosity | Pa·s | 22 | 13 | 13 | 12 |
| TI |  | 0.8 | 0.8 | 0.8 | 0.7 |
| Injection property | sec | 134 | 145 | 163 | 120 |
| Adhesion property | N | 363 | 363 | 363 | 363 |

(3-5) Average Particle Size of Large-Diameter Silica Filler

Table 5 shows the compositions of the epoxy resin compositions and evaluation results in Examples 3, 19, and 20 and Comparative Example 6. In Table 5, the average particle size of the component (D) varies. Defects were not observed in the dispersion index test when the average particle size of the component (D) was in the range of 0.2 to 2 μm. As the average particle size of the component (D) is smaller, the dispersion index is improved but on the contrary, the viscosity degrades. When the average particle size of the component (D) is 0.2 μm (Comparative Example 6), the viscosity was as high as 195 Pa·s. From the viewpoint of the viscosity appropriate as the sealing agent, the average particle size of the component (D) is preferably 0.3 μm or more.

TABLE 5

|  |  |  | Comparative Example 6 | Example 19 | Example 3 | Example 20 |
|---|---|---|---|---|---|---|
| Composition | Component (A) | a1 | 29.7 | 29.7 | 29.7 | 29.7 |
|  |  | a2 |  |  |  |  |
|  |  | a3 |  |  |  |  |
|  |  | a4 |  |  |  |  |
|  |  | a5 |  |  |  |  |
|  | Component (B) | b1 | 12.0 | 12.0 | 12.0 | 12.0 |
|  |  | b2 |  |  |  |  |
|  |  | b3 |  |  |  |  |
|  |  | b4 |  |  |  |  |
|  |  | b5 |  |  |  |  |
|  | Component (C) | 10 nm | 2.0 | 2.0 | 2.0 | 2.0 |
|  |  | 50 nm |  |  |  |  |
|  |  | 100 nm |  |  |  |  |
|  | Component (D) | 0.2 μm | 55.0 |  |  |  |
|  |  | 0.3 μm |  | 55.0 |  |  |
|  |  | 0.6 μm |  |  | 55.0 |  |
|  |  | 1 μm |  |  |  |  |
|  |  | 2 μm |  |  |  | 55.0 |
|  | Surface processing agent for Component (D) |  | f1 | f1 | f1 | f1 |
|  | Equivalent ratio | eq | 1.0 | 1.0 | 1.0 | 1.0 |
|  | Component (E) | e1 | 1.3 | 1.3 | 1.3 | 1.3 |
|  |  | e2 |  |  |  |  |
|  |  | e3 |  |  |  |  |
|  |  | e4 |  |  |  |  |
|  |  | e5 |  |  |  |  |
|  |  | e6 |  |  |  |  |
|  |  | e7 |  |  |  |  |

TABLE 5-continued

|  |  |  | Comparative Example 6 | Example 19 | Example 3 | Example 20 |
|---|---|---|---|---|---|---|
|  |  | e8 |  |  |  |  |
|  |  | e9 |  |  |  |  |
|  | Promoter |  |  |  |  |  |
|  | Total |  | 100.0 | 100.0 | 100.0 | 100.0 |
| Evaluation | Dispersion index |  | 104 | 85 | 73 | 55 |
|  | Viscosity | Pa·s | 195 | 66 | 22 | 27 |
|  | TI |  | 0.4 | 0.8 | 0.8 | 1.1 |
|  | Injection property | sec | 470 | 218 | 134 | 124 |
|  | Adhesion strength | N | 402 | 392 | 363 | 372 |

(3-6) Amount of Large-Diameter Silica Filler

Table 6 shows the compositions of the epoxy resin compositions and evaluation results in Examples 3 and 21 to 24 and Comparative Examples 7 to 9. In Table 6, the content amount of the component (D) varies. The dispersion index was improved when the content amount of the component (D) was in the range of 52 to 75 mass %. When a large amount of the component (D) was contained, however, the injection property degraded. In particular, defects were observed in the injection property test when the component (D) was contained by 76 mass % (Comparative Example 9). From the viewpoint of the injection property appropriate as the sealing agent, the component (D) is preferably contained by 75% or less. It has been confirmed that when the total amount of the components (C) and (D) is less than 50.1 mass % (Comparative Examples 7 and 8), the dispersion index of the epoxy resin composition is below 50.

TABLE 6

|  |  |  | Comparative Example 7 | Example 21 | Example 3 | Example 22 | Comparative Example 8 | Example 23 | Example 24 | Comparative Example 9 |
|---|---|---|---|---|---|---|---|---|---|---|
| Composition | Component (A) | a1 | 34.6 | 33.2 | 29.7 | 20.8 |  |  |  |  |
|  |  | a2 |  |  |  |  |  |  |  |  |
|  |  | a3 |  |  |  |  |  |  |  |  |
|  |  | a4 |  |  |  |  |  |  |  |  |
|  |  | a5 |  |  |  |  | 33.0 | 31.7 | 15.2 | 14.6 |
|  | Component (B) | b1 | 13.9 | 13.4 | 12.0 | 8.3 | 15.5 | 14.9 | 7.1 | 6.8 |
|  |  | b2 |  |  |  |  |  |  |  |  |
|  |  | b3 |  |  |  |  |  |  |  |  |
|  |  | b4 |  |  |  |  |  |  |  |  |
|  |  | b5 |  |  |  |  |  |  |  |  |
|  | Component (C) | 10 nm | 2.0 | 2.0 | 2.0 | 2.0 | 2.0 | 2.0 | 2.0 | 2.0 |
|  |  | 50 nm |  |  |  |  |  |  |  |  |
|  |  | 100 nm |  |  |  |  |  |  |  |  |
|  | Component (D) | 0.2 μm |  |  |  |  |  |  |  |  |
|  |  | 0.3 μm |  |  |  |  |  |  |  |  |
|  |  | 0.6 μm | 48.0 | 50.0 | 55.0 | 68.0 |  |  |  |  |
|  |  | 1 μm |  |  |  |  | 48.0 | 50.0 | 75.0 | 76.0 |
|  |  | 2 μm |  |  |  |  |  |  |  |  |
|  | Surface processing agent for Component (D) |  | f1 | f1 | f1 | f1 | f1 | f1 | f1 | f1 |
|  | Equivalent ratio | eq | 1.0 | 1.0 | 1.0 | 1.0 | 1.0 | 1.0 | 1.0 | 1.0 |
|  | Component (E) | e1 | 1.5 | 1.4 | 1.3 | 0.9 | 1.5 | 1.4 | 0.7 | 0.6 |
|  |  | e2 |  |  |  |  |  |  |  |  |
|  |  | e3 |  |  |  |  |  |  |  |  |
|  |  | e4 |  |  |  |  |  |  |  |  |
|  |  | e5 |  |  |  |  |  |  |  |  |
|  |  | e6 |  |  |  |  |  |  |  |  |
|  |  | e7 |  |  |  |  |  |  |  |  |
|  |  | e8 |  |  |  |  |  |  |  |  |
|  |  | e9 |  |  |  |  |  |  |  |  |
|  | Promoter |  |  |  |  |  |  |  |  |  |
|  | Total |  | 100.0 | 100.0 | 100.0 | 100.0 | 100.0 | 100.0 | 100.0 | 100.0 |
| Evaluation | Dispersion index |  | 43 | 56 | 73 | 87 | 41 | 55 | 90 | 95 |
|  | Viscosity | Pa·s | 14 | 19 | 22 | 95 | 2 | 3 | 36 | 55 |
|  | TI |  | 0.9 | 0.9 | 0.8 | 0.9 | 0.4 | 0.6 | 0.4 | 0.4 |
|  | Injection property | sec | 96 | 102 | 134 | 480 | 107 | 110 | 1132 | — |
|  | Adhesion strength | N | 353 | 353 | 363 | 392 | 323 | 323 | 392 | 392 |

(3-7) Surface Processing for Large-Diameter Silica Filler

Table 7 shows the compositions of the epoxy resin compositions and evaluation results in Examples 3 and 25 to 27. In Table 7, the surface processing for the component (D) varies. Defects were not observed in the dispersion index test regardless of whether the component (D) has been subjected or not subjected to the surface processing with the use of a silane coupling agent having any of the epoxy group, methacrylic group, and amino group.

TABLE 7

|  |  |  | Example 25 | Example 3 | Example 26 | Example 27 |
|---|---|---|---|---|---|---|
| Composition | Component (A) | a1 | 29.7 | 29.7 | 29.7 | 29.7 |
|  |  | a2 |  |  |  |  |
|  |  | a3 |  |  |  |  |
|  |  | a4 |  |  |  |  |
|  |  | a5 |  |  |  |  |
|  | Component (B) | b1 | 12.0 | 12.0 | 12.0 | 12.0 |
|  |  | b2 |  |  |  |  |
|  |  | b3 |  |  |  |  |
|  |  | b4 |  |  |  |  |
|  |  | b5 |  |  |  |  |
|  | Component (C) | 10 nm | 2.0 | 2.0 | 2.0 | 2.0 |
|  |  | 50 nm |  |  |  |  |
|  |  | 100 nm |  |  |  |  |
|  | Component (D) | 0.2 μm |  |  |  |  |
|  |  | 0.3 μm |  |  |  |  |
|  |  | 0.6 μm | 55.0 | 55.0 | 55.0 | 55.0 |
|  |  | 1 μm |  |  |  |  |
|  |  | 2 μm |  |  |  |  |
|  | Surface processing agent for Component (D) |  | None | f1 | f2 | f3 |
|  | Equivalent ratio | eq | 1.0 | 1.0 | 1.0 | 1.0 |
|  | Component (E) | e1 | 1.3 | 1.3 | 1.3 | 1.3 |
|  |  | e2 |  |  |  |  |
|  |  | e3 |  |  |  |  |
|  |  | e4 |  |  |  |  |
|  |  | e5 |  |  |  |  |
|  |  | e6 |  |  |  |  |
|  |  | e7 |  |  |  |  |
|  |  | e8 |  |  |  |  |
|  |  | e9 |  |  |  |  |
|  | Promoter |  |  |  |  |  |
|  | Total |  | 100.0 | 100.0 | 100.0 | 100.0 |
| Evaluation | Dispersion index |  | 72 | 73 | 70 | 92 |
|  | Viscosity | Pa·s | 25 | 22 | 37 | 33 |
|  | TI |  | 0.9 | 0.8 | 1 | 1 |
|  | Injection property | sec | 152 | 134 | 131 | 240 |
|  | Adhesion strength | N | 372 | 363 | 372 | 363 |

(3-8) Equivalent Ratio of Curing Agent

Table 8 shows the compositions of the epoxy resin compositions and evaluation results in Examples 3, 28, and 29. In Table 8, the equivalent ratio of the component (B) to the component (A) varies. Defects were not observed in the dispersion index test when the equivalent ratio of the component (B) relative to 1 equivalent of epoxy group of the component A was in the range of 0.5 equivalents or more and 1.8 equivalents or less.

TABLE 8

|  |  |  | Example 28 | Example 3 | Example 29 |
|---|---|---|---|---|---|
| Composition | Component (A) | a1 | 34.7 | 29.7 | 24.2 |
|  |  | a2 |  |  |  |
|  |  | a3 |  |  |  |
|  |  | a4 |  |  |  |
|  |  | a5 |  |  |  |
|  | Component (B) | b1 | 7.0 | 12.0 | 17.5 |
|  |  | b2 |  |  |  |
|  |  | b3 |  |  |  |
|  |  | b4 |  |  |  |
|  |  | b5 |  |  |  |
|  | Component (C) | 10 nm | 2.0 | 2.0 | 2.0 |
|  |  | 50 nm |  |  |  |
|  |  | 100 nm |  |  |  |
|  | Component (D) | 0.2 μm |  |  |  |
|  |  | 0.3 μm |  |  |  |
|  |  | 0.6 μm | 55.0 | 55.0 | 55.0 |
|  |  | 1 μm |  |  |  |
|  |  | 2 μm |  |  |  |
|  | Surface processing agent for Component (D) |  | f1 | f1 | f1 |
|  | Equivalent ratio | eq | 0.5 | 1.0 | 1.8 |
|  | Component (E) | e1 | 1.3 | 1.3 | 1.3 |
|  |  | e2 |  |  |  |

TABLE 8-continued

| | | Example 28 | Example 3 | Example 29 |
|---|---|---|---|---|
| | e3 | | | |
| | e4 | | | |
| | e5 | | | |
| | e6 | | | |
| | e7 | | | |
| | e8 | | | |
| | e9 | | | |
| Promoter | | | | |
| Total | | 100.0 | 100.0 | 100.0 |

TABLE 8-continued

| | | | Example 28 | Example 3 | Example 29 |
|---|---|---|---|---|---|
| Evaluation | Dispersion index | | 70 | 73 | 75 |
| | Viscosity | Pa·s | 17 | 22 | 21 |
| | TI | | 0.7 | 0.8 | 0.9 |
| | Injection property | sec | 123 | 134 | 125 |
| | Adhesion strength | N | 225 | 363 | 353 |

(3-9) Kind of Epoxy Resin

Table 9 shows the compositions of the epoxy resin compositions and evaluation results in Examples 3 and 30 to 33. In Table 9, the kind of the component (A) and the content ratio between the components (A) and (B) vary. Defects were not observed in the dispersion index test when the component (A) is any of the epoxy resins a1 to a5.

TABLE 9

| | | | Example 3 | Example 30 | Example 31 | Example 32 | Example 33 |
|---|---|---|---|---|---|---|---|
| Composition | Component (A) | a1 | 29.7 | | | | |
| | | a2 | | 30.5 | | | |
| | | a3 | | | 28.9 | | |
| | | a4 | | | | 24.9 | |
| | | a5 | | | | | 28.4 |
| | Component (B) | b1 | 12.0 | 11.2 | 12.8 | 16.8 | 13.3 |
| | | b2 | | | | | |
| | | b3 | | | | | |
| | | b4 | | | | | |
| | | b5 | | | | | |
| | Component (C) | 10 nm | 2.0 | 2.0 | 2.0 | 2.0 | 2.0 |
| | | 50 nm | | | | | |
| | | 100 nm | | | | | |
| | Component (D) | 0.2 µm | | | | | |
| | | 0.3 µm | | | | | |
| | | 0.6 µm | 55.0 | 55.0 | 55.0 | 55.0 | 55.0 |
| | | 1 µm | | | | | |
| | | 2 µm | | | | | |
| | Surface processing agent for Component (D) | | f1 | f1 | f1 | f1 | f1 |
| | Equivalent ratio | eq | 1.0 | 1.0 | 1.0 | 1.0 | 1.0 |
| | Component (E) | e1 | 1.3 | 1.3 | 1.3 | 1.3 | 1.3 |
| | | e2 | | | | | |
| | | e3 | | | | | |
| | | e4 | | | | | |
| | | e5 | | | | | |
| | | s6 | | | | | |
| | | e7 | | | | | |
| | | e8 | | | | | |
| | | e9 | | | | | |
| | Promoter | | | | | | |
| | Total | | 100.0 | 100.0 | 100.0 | 100.0 | 100.0 |
| Evaluation | Dispersion index | | 73 | 70 | 78 | 74 | 72 |
| | Viscosity | Pa·s | 22 | 39 | 93 | 17 | 5 |
| | TI | | 0.8 | 1 | 1 | 0.9 | 0.6 |
| | Injection property | sec | 134 | 135 | 158 | 120 | 116 |
| | Adhesion strength | N | 363 | 382 | 421 | 353 | 343 |

(3-10) Kind of Curing Agent

Table 10 shows the compositions of the epoxy resin compositions and evaluation results in Examples 3 and 34 to 37. In Table 10, the kind of the component (B) and the content ratio between the components (A) and (B) vary. Defects were not observed in the dispersion index test when the component (B) is any of the curing agents b1 to b5.

TABLE 10

| Composition | | | Example 3 | Example 34 | Example 35 | Example 36 | Example 37 |
|---|---|---|---|---|---|---|---|
| Composition | Component (A) | a1 | 29.7 | 30.1 | 32.5 | 16.6 | 22.2 |
| | | a2 | | | | | |
| | | a3 | | | | | |
| | | a4 | | | | | |
| | | a5 | | | | | |
| | Component (B) | b1 | 12.0 | | | | |
| | | b2 | | 11.6 | | | |
| | | b3 | | | 9.2 | | |
| | | b4 | | | | 24.7 | |
| | | b5 | | | | | 19.1 |
| | Component (C) | 10 nm | 2.0 | 2.0 | 2.0 | 2.0 | 2.0 |
| | | 50 nm | | | | | |
| | | 100 nm | | | | | |
| | Component (D) | 0.2 μm | | | | | |
| | | 0.3 μm | | | | | |
| | | 0.6 μm | 55.0 | 55.0 | 55.0 | 55.0 | 55.0 |
| | | 1 μm | | | | | |
| | | 2 μm | | | | | |
| | Surface processing agent for Component (D) | | f1 | f1 | f1 | f1 | f1 |
| | Equivalent ratio | eq | 1.0 | 1.0 | 1.0 | 1.0 | 1.0 |
| | Component (E) | e1 | 1.3 | 1.3 | 1.3 | 1.3 | 1.3 |
| | | e2 | | | | | |
| | | e3 | | | | | |
| | | e4 | | | | | |
| | | e5 | | | | | |
| | | e6 | | | | | |
| | | e7 | | | | | |
| | | e8 | | | | | |
| | | e9 | | | | | |
| | Promoter | | | | | 0.4 | 0.4 |
| | Total | | 100.0 | 100.0 | 100.0 | 100.0 | 100.0 |
| Evaluation | Dispersion index | | 73 | 65 | 56 | 86 | 90 |
| | Index | Pa·s | 22 | 16 | 12 | 16 | 53 |
| | TI | | 0.8 | 0.8 | 0.9 | 1.5 | 1.3 |
| | Injection property | sec | 134 | 121 | 92 | 120 | 210 |
| | Adhesion strength | N | 363 | 284 | 206 | 284 | 304 |

The epoxy resin composition according to the present invention may be any of the following first to eighth epoxy resin compositions.

The first epoxy resin composition is an epoxy resin composition including: (A) epoxy resin; (B) a curing agent; (C) 0.1 to 10 mass % of silica filler with an average particle size of 10 nm or more and 100 nm or less: (D) 47 to 75 mass % of silica filler with an average particle size of 0.3 μm or more and 2 μm or less; and (E) 0.1 to 8 mass % of elastomer, wherein the component (C) and the component (D) are contained by 47.1 to 77 mass % in total.

The second epoxy resin composition is the first epoxy resin composition, wherein at least one of the component (C) and the component (D) is subjected to surface processing with a silane coupling agent.

The third epoxy resin composition is the first or second epoxy resin composition, wherein the component (D) is subjected to surface processing with amino silane with a structure represented by Formula (1):

[Chemical Formula 3]

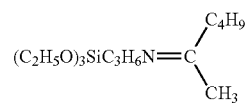

(1)

The fourth epoxy resin composition is any of the first to third epoxy resin compositions, wherein the component (B) is included by 0.5 equivalents or more and 1.8 equivalents or less relative to 1 equivalent of epoxy group of the component (A).

The fifth epoxy resin composition is any of the first to fourth epoxy resin compositions, wherein the component (B) is an acid anhydride curing agent, a phenolic resin curing agent, or an amine curing agent.

The sixth epoxy resin composition is any of the first to fifth epoxy resin compositions, wherein the component (A) includes at least one of bisphenol F epoxy resin, bisphenol A epoxy resin, naphthalene epoxy resin, and aminophenol epoxy resin.

The seventh epoxy resin composition is any of the first to sixth epoxy resin compositions, wherein the component (E)

includes at least one of butadiene elastomer, silicone elastomer, acrylic copolymer, styrene butadiene elastomer, butadiene acrylonitrile 2,3-epoxypropyl methacrylate divinylbenzene copolymer, butadiene acrylonitrile methacrylic acid divinylbenzene copolymer, amino-terminated butadiene acrylonitrile copolymer, and carboxyl-terminated butadiene acrylonitrile copolymer.

The eighth epoxy resin composition is any of the first to seventh epoxy resin compositions, wherein the epoxy resin composition is manufactured in a manner that a master batch is formed by mixing the (C) silica filler with an average particle size of 10 to 100 nm in at least a part of the (A) epoxy resin and another component is mixed in the master batch.

The semiconductor sealing agent according to the present invention may be any of the following first to fourth semiconductor sealing agents.

The first semiconductor sealing agent is a semiconductor sealing agent including any of the first to eighth epoxy resin compositions.

The second semiconductor sealing agent is the first semiconductor sealing agent, wherein a conductor part of the semiconductor device to be sealed is formed of two or more kinds of metals or alloys.

The third semiconductor sealing agent is the second semiconductor sealing agent, wherein the conductor part of the semiconductor device to be sealed is formed of two or more kinds of metals or alloys based on metals and the metals are selected from the group consisting of Au, Ag, Cu, Sn, Pb, Ni, Pd, Co, Cd, Bi, In, Sb, and Zn.

The fourth semiconductor sealing agent is the first semiconductor sealing agent, wherein: the conductor part of the semiconductor device to be sealed includes two kinds of metals or alloys; and a cross section of the epoxy resin composition sealing the conductor part is divided into two regions along a border between the two kinds of metals or alloys, and a filler dispersion index calculated based on an area ratio between the components (C) and (D) in each region is 50 or more and 150 or less.

The semiconductor device according to the present invention is a semiconductor device including any of the first to fourth semiconductor sealing agents.

LIST OF NUMERAL REFERENCES

1 Wiring substrate
10 Under-filling agent
2 Electrode terminal
3 Insulating film
4 Solder
5 Chip board
7 Electrode terminal
8 Copper pillar
9 Passivation
L Border

The invention claimed is:
1. An epoxy resin composition comprising:
(A) epoxy resin;
(B) a curing agent;
(C) 0.1 to 10 mass % of silica filler with an average particle size of 10 nm to 100 nm;
(D) 47 to 75 mass % of silica filler with an average particle size of 0.3 μm to 2 μm; and
(E) 0.1 to 8 mass % of elastomer, wherein
the component (C) and the component (D) are contained by 50.1 to 77 mass % in total, and the component (D) is subjected to surface processing with amino silane with a structure represented by Formula (1):

[Chemical Formula 1]

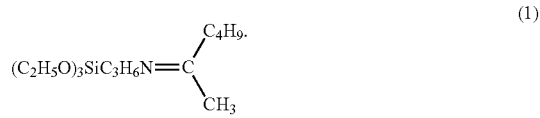

2. The epoxy resin composition according to claim 1, wherein 0.5 equivalents to 1.8 equivalents of the component (B) are included in 1 equivalent of epoxy group of the component (A).

3. The epoxy resin composition according to claim 1, wherein the component (B) is an acid anhydride curing agent, a phenolic resin curing agent, or an amine curing agent.

4. The epoxy resin composition according to claim 1, wherein the component (A) includes at least one of bisphenol F epoxy resin, bisphenol A epoxy resin, naphthalene epoxy resin, and aminophenol epoxy resin.

5. The epoxy resin composition according to claim 1, wherein the epoxy resin composition is manufactured in a manner that a master batch is formed by mixing the component (C) in at least a part of the component (A) and another component is mixed in the master batch.

6. A semiconductor sealing agent comprising the epoxy resin composition according to claim 1.

7. The semiconductor sealing agent according to claim 6 for sealing a conductor part of a semiconductor device, the conductor part being formed of two or more kinds of metals or alloys.

8. The semiconductor sealing agent according to claim 7, wherein the two or more kinds of metals or alloys are two or more kinds of metals or alloys based on the metals, and the metals are selected from the group consisting of Au, Ag, Cu, Sn, Pb, Ni, Pd, Co, Cd, Bi, In, Sb, and Zn.

9. The semiconductor sealing agent according to claim 7, wherein
the conductor part of the semiconductor device to be sealed includes two kinds of metals or alloys, and
a cross section of the epoxy resin composition sealing the conductor part is divided into a region Ra and a region Rb along a border between the two kinds of metals or alloys, and a filler dispersion index calculated by a formula below using an occupation ratio of the components (C) and (D) in the region Ra and an occupation ratio of the components (C) and (D) in the region Rb is 50 to 150, Filler dispersion index=100×(occupation ratio of region $Ra$)/(occupation ratio of region $Rb$).

10. A semiconductor device comprising the semiconductor sealing agent according to claim 6.

11. An epoxy resin composition comprising:
(A) epoxy resin;
(B) a curing agent
(C) 0.1 to 10 mass % of silica filler with an average particle size of 10 nm to 100 nm;
(D) 47 to 75 mass % of silica filler with an average particle size of 0.3 μm to 2 μm; and
(E) 0.1 to 8 mass % of elastomer, wherein
the component (C) and the component (D) are contained by 50.1 to 77 mass % in total, the component (E) includes at least one of butadiene elastomer, acrylic copolymer, styrene butadiene elastomer, butadiene acrylonitrile 2,3-epoxypropyl methacrylate divinylbenzene copolymer, butadiene acrylonitrile methacrylic acid divinylbenzene copolymer, amino-terminated butadiene acrylonitrile copolymer, and carboxyl-terminated butadiene acrylonitrile copolymer, at least one of the component (C) and the component (D) is subjected to surface processing with a silane coupling agent, and the component (D) is subjected to surface processing with amino silane with a structure represented by Formula (1):

[Chemical Formula 1]

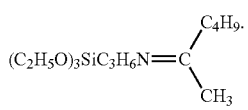

(1)

12. The epoxy resin composition according to claim 11, wherein 0.5 equivalents to 1.8 equivalents of the component (B) are included in 1 equivalent of epoxy group of the component (A).

13. The epoxy resin composition according to claim 11, wherein the component (B) is an acid anhydride curing agent, a phenolic resin curing agent, or an amine curing agent.

14. The epoxy resin composition according to claim 11, wherein the component (A) includes at least one of bisphenol F epoxy resin, bisphenol A epoxy resin, naphthalene epoxy resin, and aminophenol epoxy resin.

15. The epoxy resin composition according to claim 11, wherein the epoxy resin composition is manufactured in a manner that a master batch is formed by mixing the component (C) in at least a part of the component (A) and another component is mixed in the master batch.

* * * * *